(12) United States Patent
Tsukada (10) Patent No.: US 8,054,643 B2
(45) Date of Patent: Nov. 8, 2011

(54) SEMICONDUCTOR MODULE, WIRING BOARD, AND WIRING METHOD

(75) Inventor: Wataru Tsukada, Tokyo (JP)

(73) Assignee: Elpida Memory, Inc., Tokyo (JP)

(*) Notice: Subject to any disclaimer, the term of this patent is extended or adjusted under 35 U.S.C. 154(b) by 332 days.

(21) Appl. No.: 12/320,641

(22) Filed: Jan. 30, 2009

(65) Prior Publication Data

US 2009/0196009 A1    Aug. 6, 2009

(30) Foreign Application Priority Data

Jan. 31, 2008   (JP) .................................. 2008-020088

(51) Int. Cl.
*H05K 7/02* (2006.01)

(52) U.S. Cl. ........ 361/777; 361/778; 361/736; 361/803; 361/760; 365/63; 257/723

(58) Field of Classification Search .................. 361/736, 361/760, 764, 777, 778, 803, 783; 357/723; 365/63; 257/723

See application file for complete search history.

(56) References Cited

U.S. PATENT DOCUMENTS

| 6,181,004 B1* | 1/2001 | Koontz et al. ................. 257/691 |
| 6,882,556 B2 | 4/2005 | Fuhrmann et al. |
| 7,315,454 B2* | 1/2008 | Schuster ....................... 361/736 |
| 7,375,971 B2* | 5/2008 | RaghuRam et al. ........... 361/736 |
| 2004/0022100 A1 | 2/2004 | Fuhrmann et al. |
| 2007/0091704 A1* | 4/2007 | RaghuRam et al. .......... 365/218 |
| 2007/0096302 A1* | 5/2007 | Schuster ....................... 257/723 |

FOREIGN PATENT DOCUMENTS

| JP | 11-163531 | 6/1999 |
| JP | 11-340438 | 12/1999 |
| JP | 2000-82743 | 3/2000 |
| JP | 2004-96095 | 3/2004 |

* cited by examiner

*Primary Examiner* — Dameon Levi

(74) *Attorney, Agent, or Firm* — McGinn IP Law Group, PLLC (57) ABSTRACT

A semiconductor module includes a plurality of rectangular shaped semiconductor devices which are arranged in two rows such that each pair of adjacent semiconductor devices is in orientations differed by 90 degrees from each other. A plurality of wirings connect the semiconductor devices included in one of the two rows to the semiconductor devices included in the other row such that the semiconductor devices arranged in the same orientations are connected to each other.

20 Claims, 12 Drawing Sheets

SEMICONDUCTOR MODULE, WIRING BOARD, AND WIRING METHOD

This application is based upon and claims the benefit of priority from Japanese Patent Application No. 2008-020088, filed on Jan. 31, 2008, the disclosure of which is incorporated herein in its entirety by reference.

BACKGROUND OF THE INVENTION

The present invention relates to a semiconductor module having a plurality of mutually electrically connected semiconductor devices arranged on a wiring board, and in particular to a wiring board and a wiring method for such a semiconductor module.

It is a recent trend that semiconductor devices are packaged to form a longitudinally long (rectangular) shape in order to achieve high performances. For this reason, it is difficult to produce semiconductor module by arranging a quantity of semiconductor devices specified by standards or the like on a wiring board with a shape specified by the specifications or a customer request.

One of measures proposed to avoid this problem is a method of arranging a plurality of semiconductor devices alternately lengthwise and crosswise while changing alternately their orientations by 90 degrees.

On the other hand, various wiring methods have been proposed to eliminate the signal-to-signal skew (for example, Japanese Patent Laid-Open Publication No. H11-163531 (Patent Document 1), No. 2000-082743 (Patent Document 2), No. 2004-096095 (Patent Document 3), and No. H11-340438 (Patent Document 4)).

SUMMARY

In general, a plurality of signal wiring lines included in a signal wiring group connecting between semiconductor devices are required to have equal lengths in order to uniform their electrical characteristics to minimize signal-to-signal skew. However, in the case of a semiconductor module having semiconductor devices arranged such that each pair of adjacent semiconductor devices has orientations differed by 90 degrees from each other, a signal wiring group of wiring lines connecting between the semiconductor devices must be laid out in a meander shape according to arrangement of pads of the semiconductor devices due to limitations of a wiring region. Consequently, some of the signal wiring lines necessarily take a longer way while some take a shorter way, making it difficult to equalize the lengths of the signal wiring lines. The present inventor has recognized that the skew (delay time difference) between the signal wiring lines is increased and that the high-speed operation required for the semiconductor devices cannot be achieved.

The present invention seeks to provide a semiconductor module in which each pair of adjacent semiconductor devices is arranged in orientations differed by 90 degrees from each other, the semiconductor device being mutually connected by means of a plurality of signal wiring lines having substantially equal lengths, whereby signal-to-signal skew is reduced.

None of Patent Documents 1 to 4 mentioned above discusses a semiconductor module having each pair of adjacent semiconductor devices arranged in orientations differed by 90 degrees from each other, and none of these patent documents discloses or suggests a technique to equalize the lengths of wiring lines in such a semiconductor module. In particular, none of Patents Documents 1 to 4 discloses or suggests at all that a plurality of semiconductor devices are arranged in two rows and via holes positioned in the vicinity of the semiconductor devices belonging to one of the rows and via holes positioned in the vicinity of the semiconductor devices belonging to the other row are connected by means of signal wiring lines in staggered manner (the signal wiring lines are laid out in a cross stitch like pattern).

In one embodiment, there is provided a semiconductor module that includes a plurality of rectangular-shaped semiconductor devices arranged in two rows such that each pair of adjacent semiconductor devices is in orientations differed by 90 degrees from each other. A plurality of wiring lines connect the semiconductor devices included in one of the two rows to the semiconductor devices included in the other row such that the semiconductor devices arranged in the same orientations are connected to each other.

The configuration of the semiconductor module makes it possible to form a plurality of signal wiring lines connecting one semiconductor device to another to have substantially equal lengths, and hence to reduce the signal-to-signal skew.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Before describing of the present invention, a related semiconductor module will be explained in detail with reference to FIGS. 1 and 2 in order to facilitate the understanding of the present invention.

Figure 1:
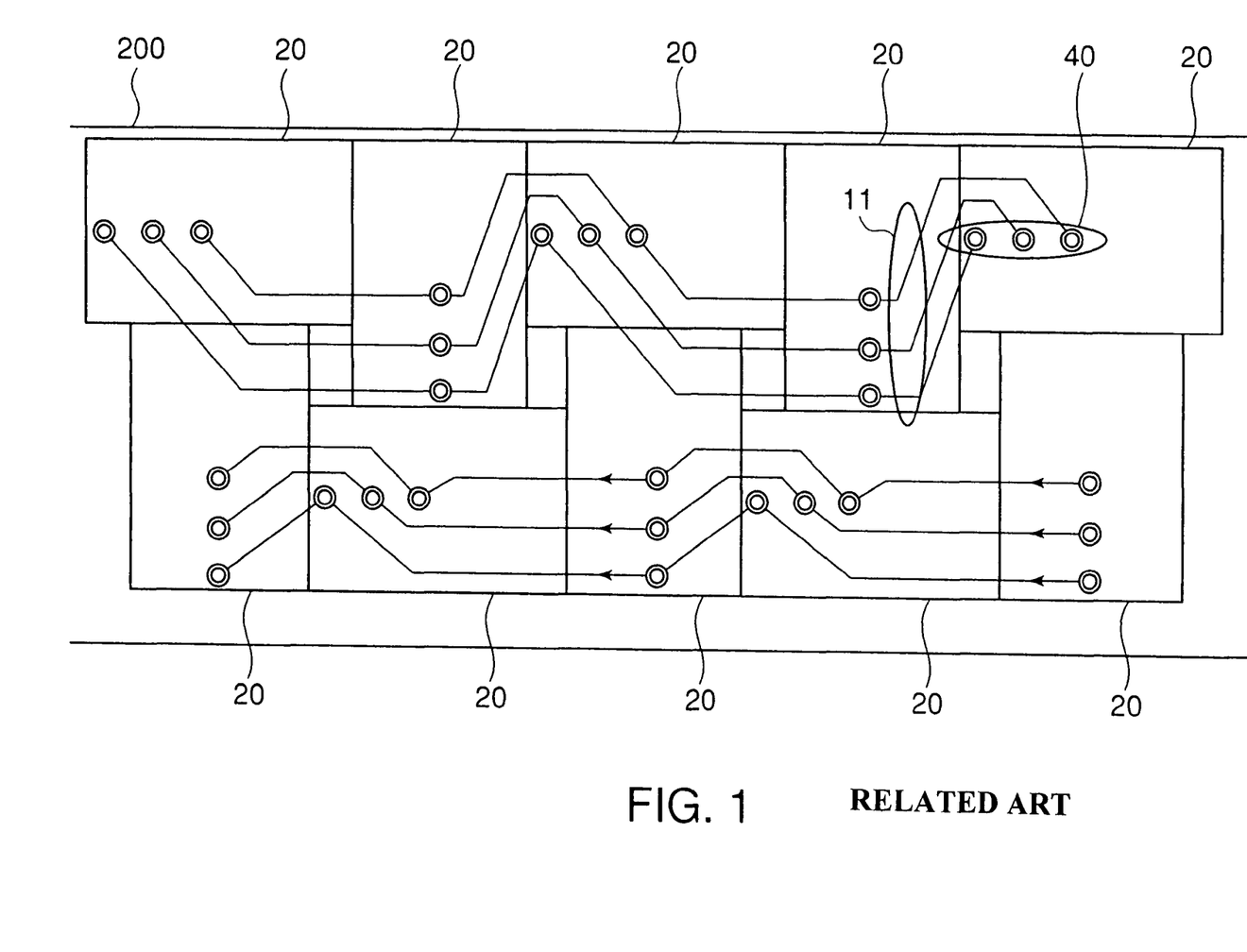
FIG. 1 is a schematic diagram showing a wiring pattern of a related semiconductor module.
Figure 2:
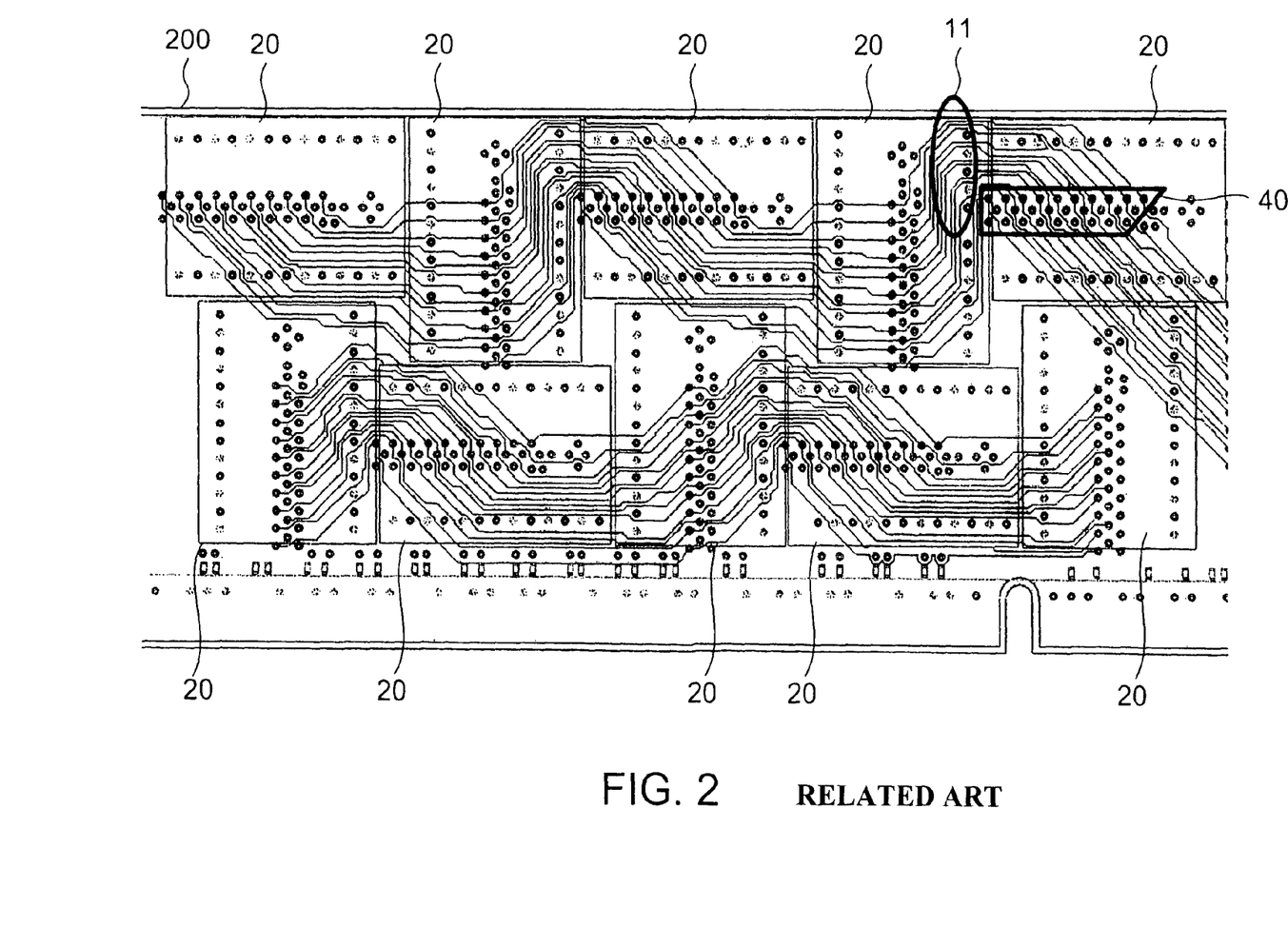
FIG. 2 is a detail diagram showing details of the wiring pattern of FIG. 1.

FIGS. 1 and 2 are plan views showing the related semiconductor module. FIG. 1 is a simplified schematic diagram of the semiconductor module. As illustrated in FIG. 1, the semiconductor module has a plurality of semiconductor devices 20 provided on a wiring board 200. FIG. 2 is a wiring pattern diagram corresponding to FIG. 1, showing a representation closer to a product image. In FIG. 2, exposed via holes are depicted by solid line double circles while embedded via holes are depicted by broken line double circles. The same holds true for FIGS. 6, 8, 10 and 12.

As shown in FIGS. 1 and 2, each of the semiconductor devices 20 is electrically connected to another and adjacent semiconductor device 20 via a signal wiring group 11 and a via hole group 40 provided on the wiring board 200.

The wiring board 200 is provided for example by a multilayer wiring board. The semiconductor devices 20 may be semiconductor memory devices such as DRAMs or semiconductor integrated circuit devices such as system LSIs.

As seen from FIGS. 1 and 2, when adjacent semiconductor devices in the same row are connected to each other, the lengths of the signal wiring lines connecting them become different from each other. As a result, the skew (delay time difference) between the signal wiring lines will be increased, which makes it impossible to achieve the high-speed operation required for the semiconductor devices 20.

Next, the invention will be described with reference to illustrative embodiments. Those skilled in the art will recognize that many alternative embodiments can be accomplished using the teachings of the present invention and that the invention is not limited to the embodiments illustrated for explanatory purposes.

Figure 3:
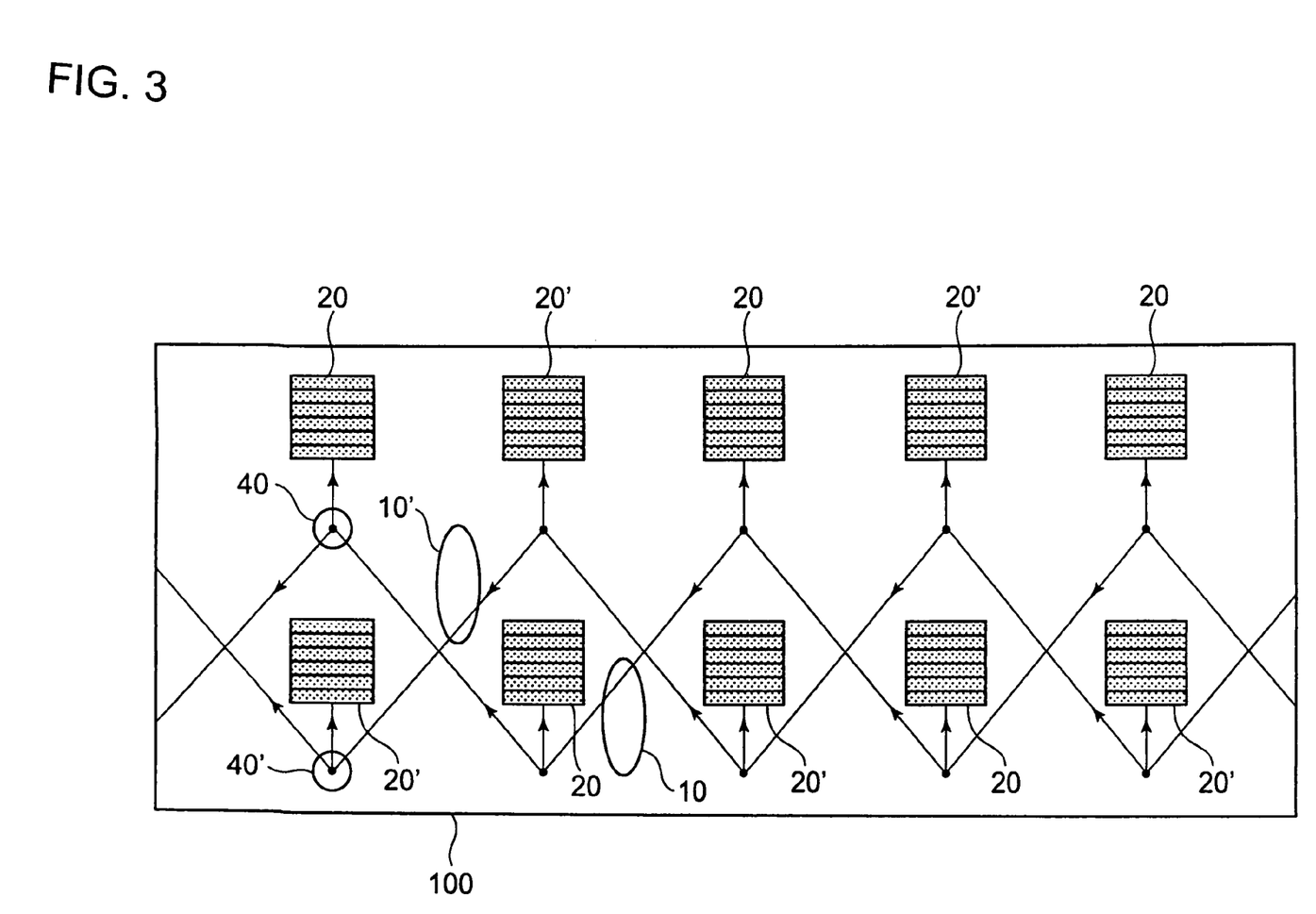
FIG. 3 is a conceptual diagram showing a semiconductor module according to a first embodiment of the present invention.

FIG. 3 is a conceptual diagram of a semiconductor module according to a first embodiment of the present invention.

The shown semiconductor module has a wiring board 100 and a plurality of semiconductor devices 20, 20' mounted thereon. The wiring board 100 has via hole groups 40, 40' to which the semiconductor devices 20, 20' are connected, and signal wiring groups (or wirings) 10, 10' connecting via holes included in these via hole groups 40, 40'.

The semiconductor devices 20 and the semiconductor devices 20' have the same configuration. The semiconductor devices 20, 20' are each provided with an index mark (a mark indicating an orientation of the semiconductor device) not shown in the drawing. The semiconductor devices 20 are arranged such that their index marks all point to the same direction, for example upwards, as viewed in the drawing. The semiconductor devices 20' are also arranged such that their index marks all point to the same direction, for example to the right-hand side, as viewed in the drawing. At the same time, the semiconductor devices 20' are arranged in an orientation differed, or rotated by 90 degrees relative to the semiconductor devices 20 arranged in one orientation. The semiconductor devices 20 and the semiconductor devices 20' are thus arranged alternately in two rows. In other words, the wiring board 100 has a region in which a plurality of rectangular-shaped semiconductor devices 20, 20' are arranged in two rows such that each pair of adjacent semiconductor devices is arranged in different orientations differed by 90 degrees from each other.

The via hole groups 40, 40' are provided corresponding to the semiconductor devices 20, 20', respectively. Each of the semiconductor devices 20, 20' is electrically connected to a via hole group 40 or 40' provided in the vicinity thereof when mounted on the wiring board 100.

Wiring lines included in each signal wiring group 10 are connected to via holes included in the via hole groups 40 provided in the vicinity of the semiconductor devices 20. Likewise, wiring lines included in each signal wiring group 10' are connected to via holes included in the via hole groups 40' provided in the vicinity of the semiconductor devices 20'.

As seen from FIG. 3, in the semiconductor module according to the shown embodiment, the signal wiring groups 10 connect, in a zigzag manner, the via hole groups 40 corresponding to the semiconductor devices 20 in one of the rows (the upper row as viewed in the drawing) and the via hole groups 40 corresponding to the semiconductor devices 20 in the other row (the lower row as viewed in the drawing). Likewise, the signal wiring groups 10' connect, in a zigzag manner, the via hole groups 40' corresponding to the semiconductor devices 20' in one of the rows (the upper row as viewed in the drawing) and the via hole groups 40' corresponding to the semiconductor device 20' in the other row (the lower row as viewed in the drawing). This means that the semiconductor devices 20, 20' belonging to one row and the semiconductor devices 20, 20' belonging to the other row are connected alternately (to form a cross stitch like pattern), while the semiconductor devices 20 are connected to each other and the semiconductor devices 20' are connected to each other.

Figure 4A:
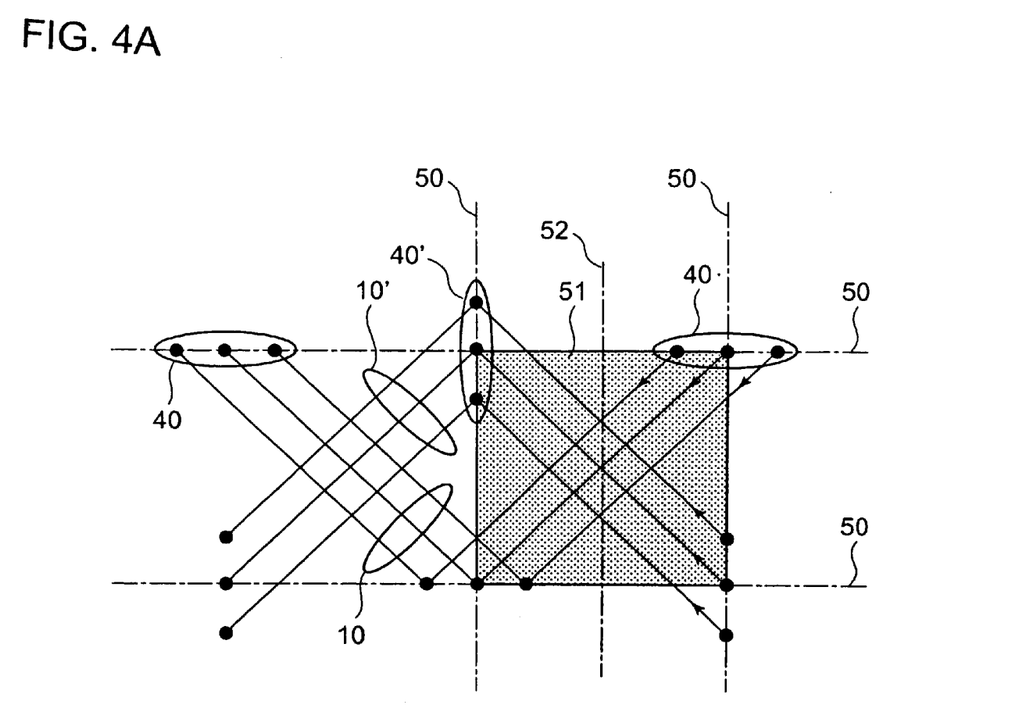
FIGS. 4A and 4B are diagrams for explaining relationships between via hole groups and signal wiring line groups in the semiconductor module of FIG. 3.
Figure 4B:
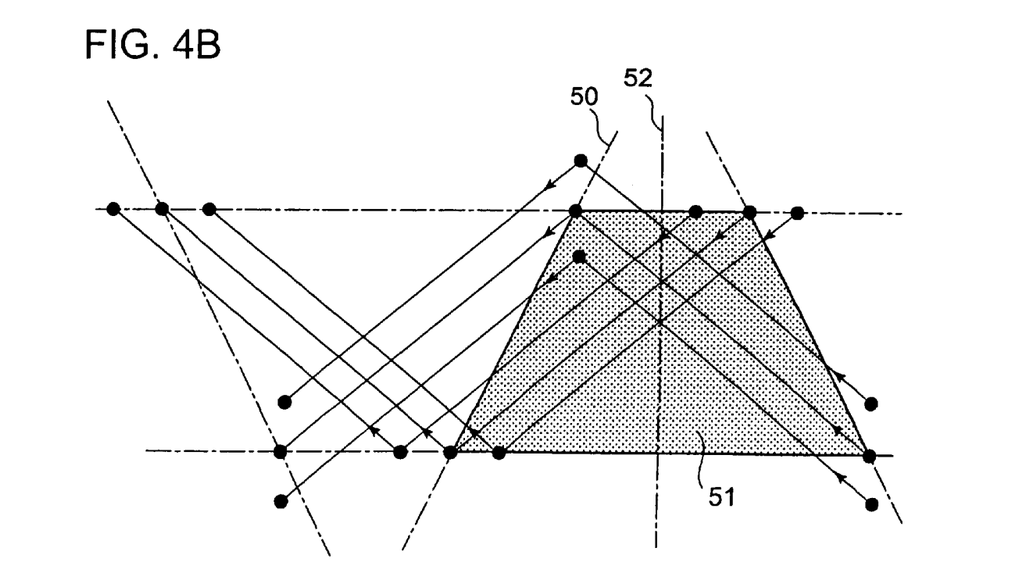

FIGS. 4A and 4B are diagrams for explaining the relationships between the via hole groups 40 and the signal wiring groups 10 in FIG. 3.

FIG. 4A shows the case in which when additional lines 50 are drawn, passing through the centers of the via hole groups 40, 40', a region 51 surrounded by four additional lines 50 assumes a rectangular shape. In this case, a plurality of (three herein) via holes included in each via hole group 40 are arranged along a longitudinal direction of the wiring board 100 (crosswise direction in the drawing). A plurality of wiring lines included in the signal wiring groups 10 connected by these via holes are parallel to the diagonal lines of the region 51 and have equal lengths. Further, a plurality of (three herein) via holes included in each via hole group 40' are arranged perpendicularly to a longitudinal direction of the wiring board 100 (crosswise direction in the drawing). A plurality of wiring lines included in the signal wiring groups 10' connected by these via holes are also parallel to the diagonal lines of the region 51 and have equal lengths. This makes it possible to prevent the occurrence of signal-to-signal skew in two semiconductor devices connected by these signal wiring groups 10 or 10'.

In the case shown in FIG. 4A, the lengths of the wiring lines of the signal wiring groups 10 connected to the via holes included in the via hole groups 40 are equal to the lengths of the wiring lines of the signal wiring groups 10' connected to the via holes included in the via hole groups 40'. Therefore, the wiring lines extending from the upper row to the lower row are of equal lengths, while the wiring lines extending from the lower row to the upper row are also of equal lengths.

FIG. 4B shows the case in which when additional lines 50 are drawn passing through the centers of the via hole groups 40, 40', a region 51 surrounded by four additional lines assumes a trapezoidal shape. In this case as well, the lengths of the signal wiring lines extending from the upper row to the lower row are equal to the lengths of the signal wiring lines extending from the lower row to the upper row.

This means that the lengths of the signal wiring lines extending from the upper row to the lower row are equal to the lengths of the signal wiring lines extending from the lower row to the upper row, as long as the region 51 surrounded by the additional lines 50 is symmetric relative to a center line 52 thereof.

In the semiconductor module according to the shown embodiment as described above, the wiring lines can be laid in equal lengths without producing wiring lines taking a longer way or wiring lines taking a shorter way. As a result, the signal-to-signal skew can be reduced.

Figure 5:
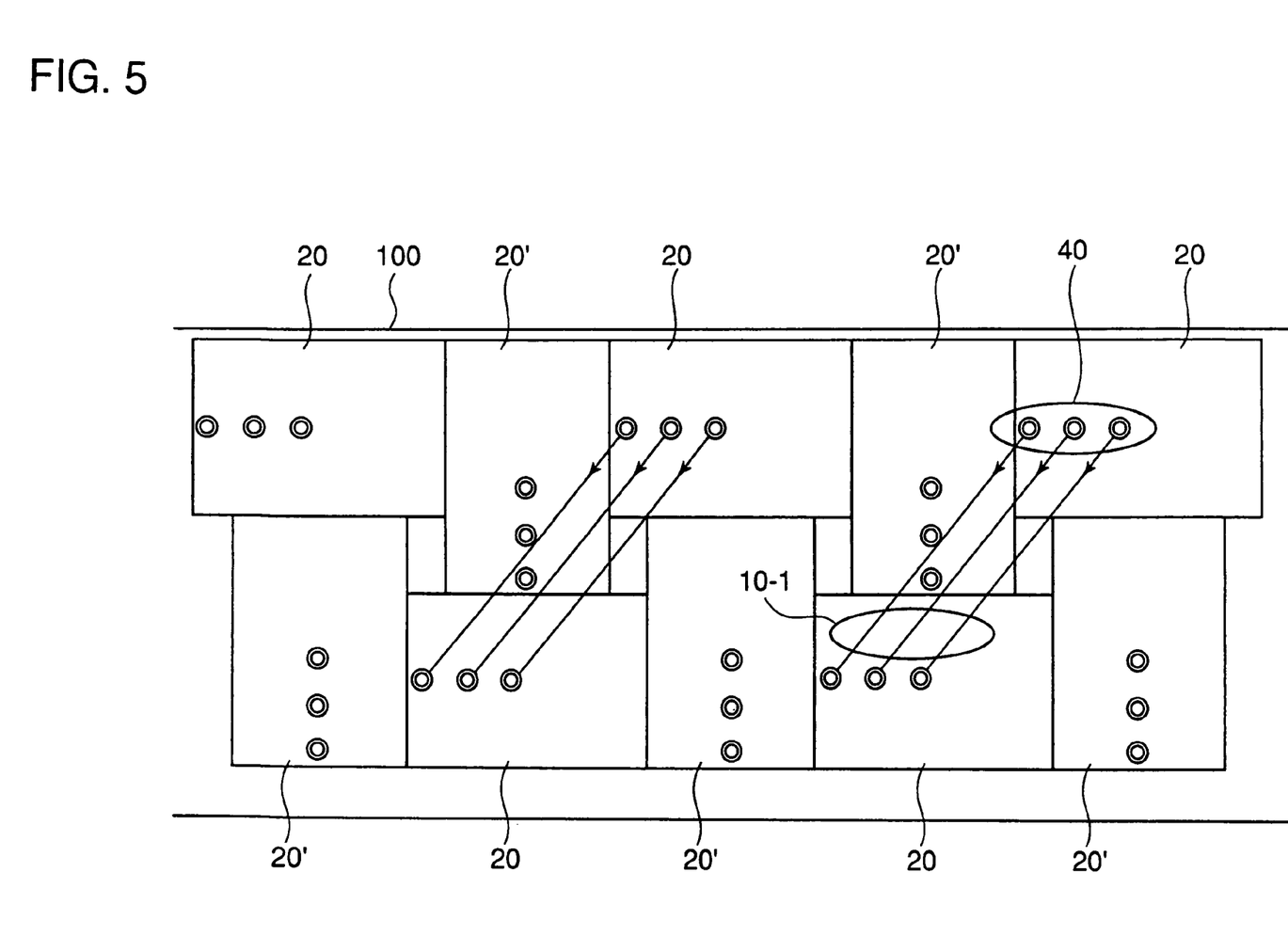
FIG. 5 is a schematic diagram showing an example of a wiring pattern in a wiring layer forming a wiring board used in the semiconductor module of FIG. 3.
Figure 6:
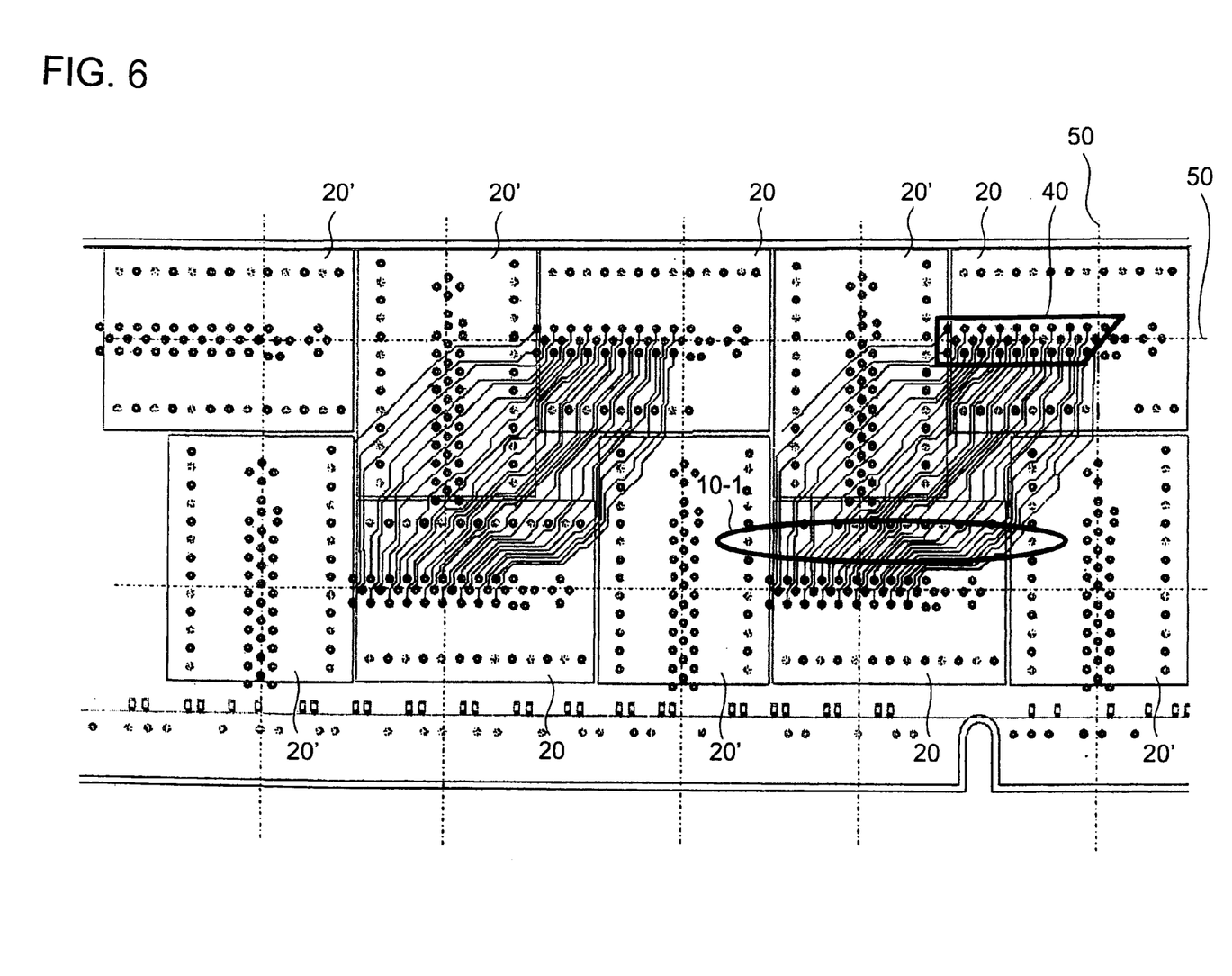
FIG. 6 is a detail diagram showing details of the wiring pattern of FIG. 5.

The wiring board 100 will be described in further detail. The wiring board 100 can be provided by using a multilayer wiring board. A multilayer wiring board has wiring layers having wiring patterns, for example, as shown in FIGS. 5 and 6. FIG. 5 is a simplified schematic diagram showing an example of a wiring pattern, and FIG. 6 is a wiring pattern diagram corresponding to the wiring pattern of FIG. 5, showing a representation closer to a product image.

As shown in FIGS. 5 and 6, the semiconductor devices 20 and the semiconductor devices 20' are arranged on the wiring board 100 in different orientations, differed by 90 degrees, as described in the above with reference to FIG. 3. A plurality of via holes included in the via hole groups 40 corresponding to the semiconductor devices 20 are arranged along a longitudinal direction of the wiring board 100.

Wiring lines included in each signal wiring group 10-1 connect between the via holes included in the via hole group 40 in the upper row and the via holes included in the via hole group 40 in the lower row, so that the semiconductor devices 20 having index marks pointing to the same direction are electrically connected to each other. In this wiring layer, the signal wiring group 10-1 connects the via hole group 40 in the upper row to the via hole group 40 located diagonally downward left in the lower row. The signal wiring groups 10-1 correspond to a half of the signal wiring groups 10 shown in FIG. 3.

Dash-dot lines 50 in FIG. 6 are the additional lines passing through the centers of the via hole groups 40. Other wiring lines than those included in the signal wiring groups 10-1 may be formed in this wiring layer.

In the wiring pattern shown in FIG. 6, when the wiring lines included in the signal wiring group 10-1 and located at the opposite ends of the group have a length of 20 mm, the wiring lines located in a central part of the group have a length of 18 mm, making a difference of about 2 mm from those located on the opposite ends. This is an acceptable difference when it is assumed that all the wiring lines included in the signal wiring group 10-1 have equal lengths. In contrast, in the signal wiring pattern according to a related wiring pattern shown in FIG. 2, when the wiring line located at the outermost side of the wiring board 200 and taking the longest way in the signal wiring group 11 connecting between adjacent semiconductor devices 20 has a length of 20 mm, the wiring line located at the center has a length of 16 mm, and the wiring line taking the shortest way has a length of 13 mm. It is thus obvious that the variation (or skew) among signals is greater than that of the wiring pattern shown in FIG. 6.

Figure 7:
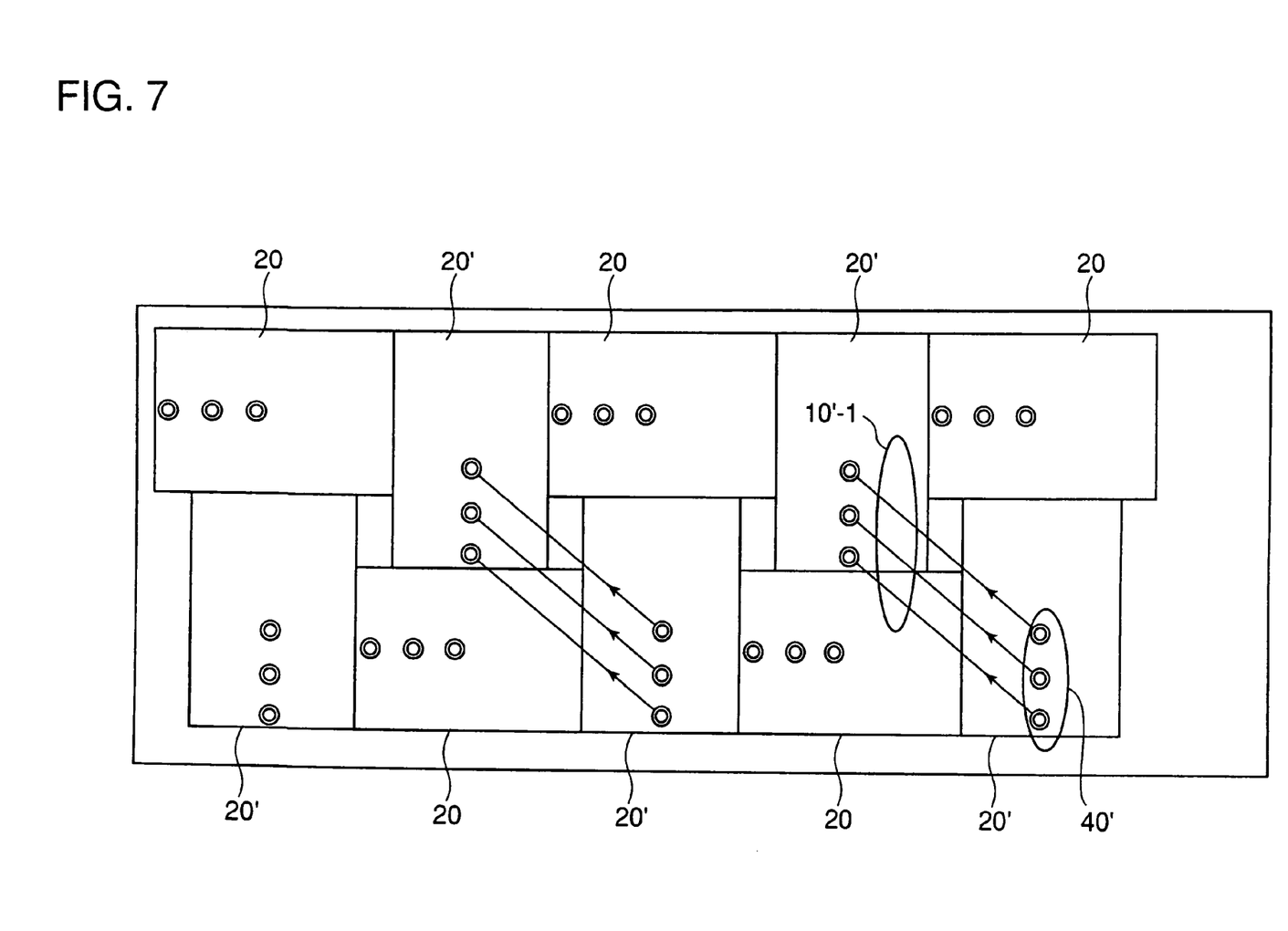
FIG. 7 is a schematic diagram showing an example of a wiring pattern in another wiring layer forming the wiring board used in the semiconductor module of FIG. 3.
Figure 8:
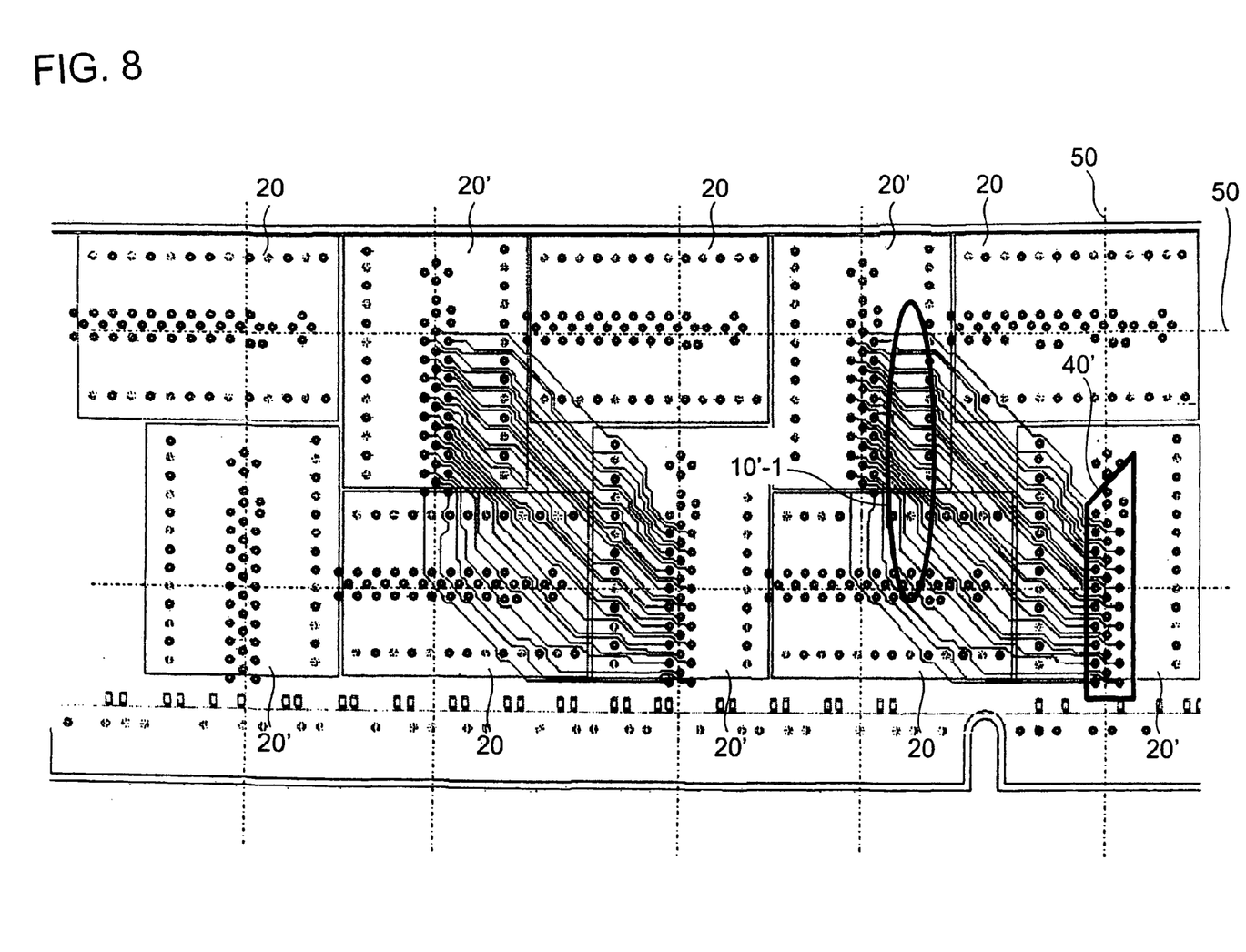
FIG. 8 is a detail diagram showing details of the wiring pattern of FIG. 7.

FIG. 7 and FIG. 8 are diagrams showing a wiring pattern in another wiring layer of the wiring board 100. FIG. 7 is a simplified schematic diagram of the wiring pattern, while FIG. 8 is a wiring pattern diagram corresponding to the wiring pattern of FIG. 7, showing a representation closer a product image.

The wiring layer shown in FIGS. 7 and 8 is provided with signal wiring groups 10'-1 connecting the via hole groups 40' provided corresponding to semiconductor devices 20'. Each of the signal wiring groups 10'-1 connects between the via holes included in the via hole group 40' in the lower row and the via holes included in the via hole group 40' located diagonally upward left in the upper row, so that the semiconductor devices 20' corresponding to these via hole groups and having index marks pointing to the same direction are electrically connected to each other. The signal wiring groups 10'-1 correspond to a half of the signal wiring groups 10' shown in FIG. 3.

As is obvious from FIG. 7, in the signal wiring group 10'-1 connecting the via hole groups 40' arranged vertically to a longitudinal direction of the wiring board 100 as well, the wiring lines located at the opposite ends of the group and the wiring lines located in a central part have equal lengths. As seen from FIG. 8, the wiring lines in the signal wiring group 10' of an actual wiring layer have substantially equal lengths.

Figure 9:
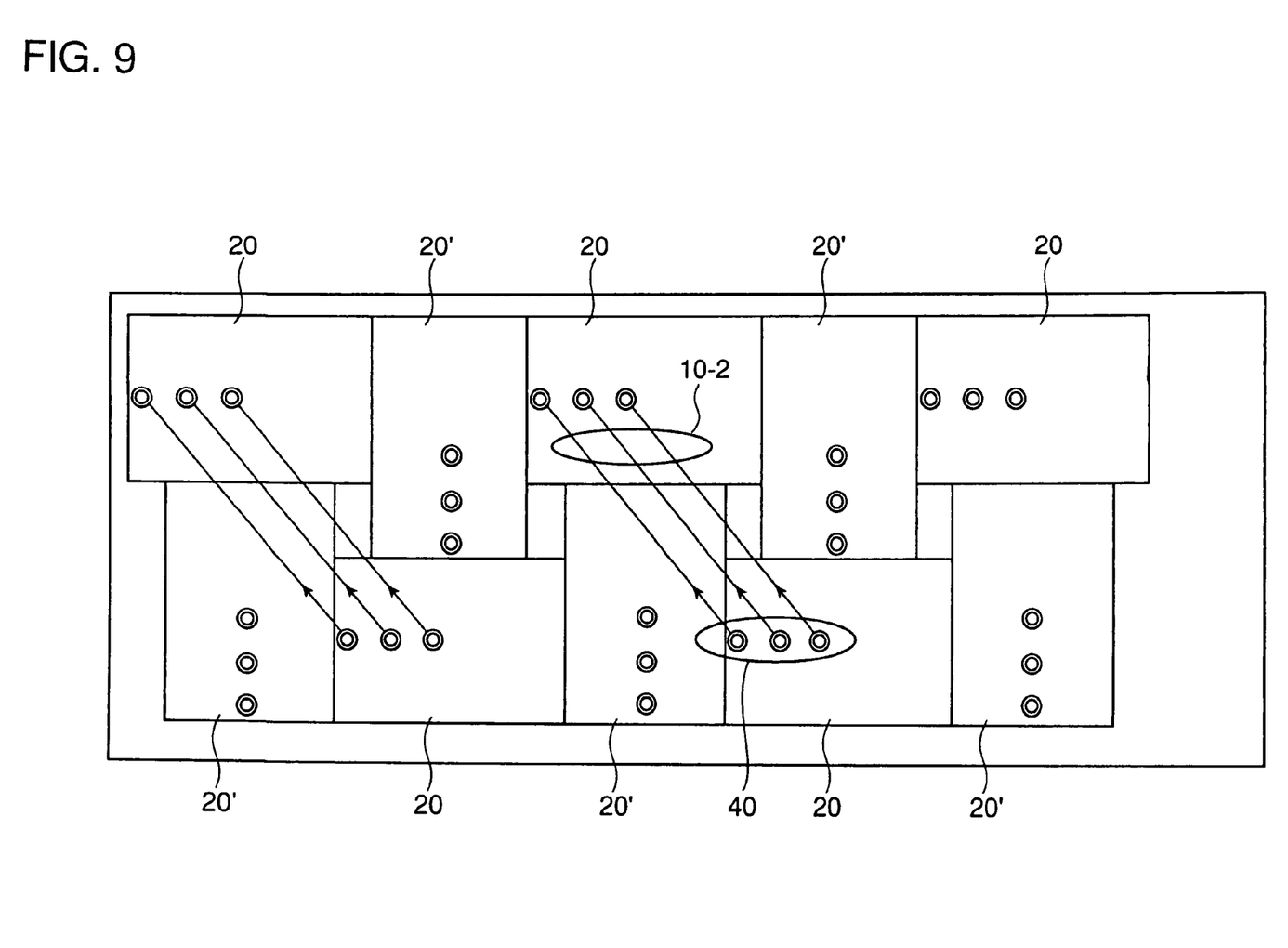
FIG. 9 is a schematic diagram showing an example of a wiring pattern in still another wiring layer forming the wiring board used in the semiconductor module of FIG. 3.
Figure 10:
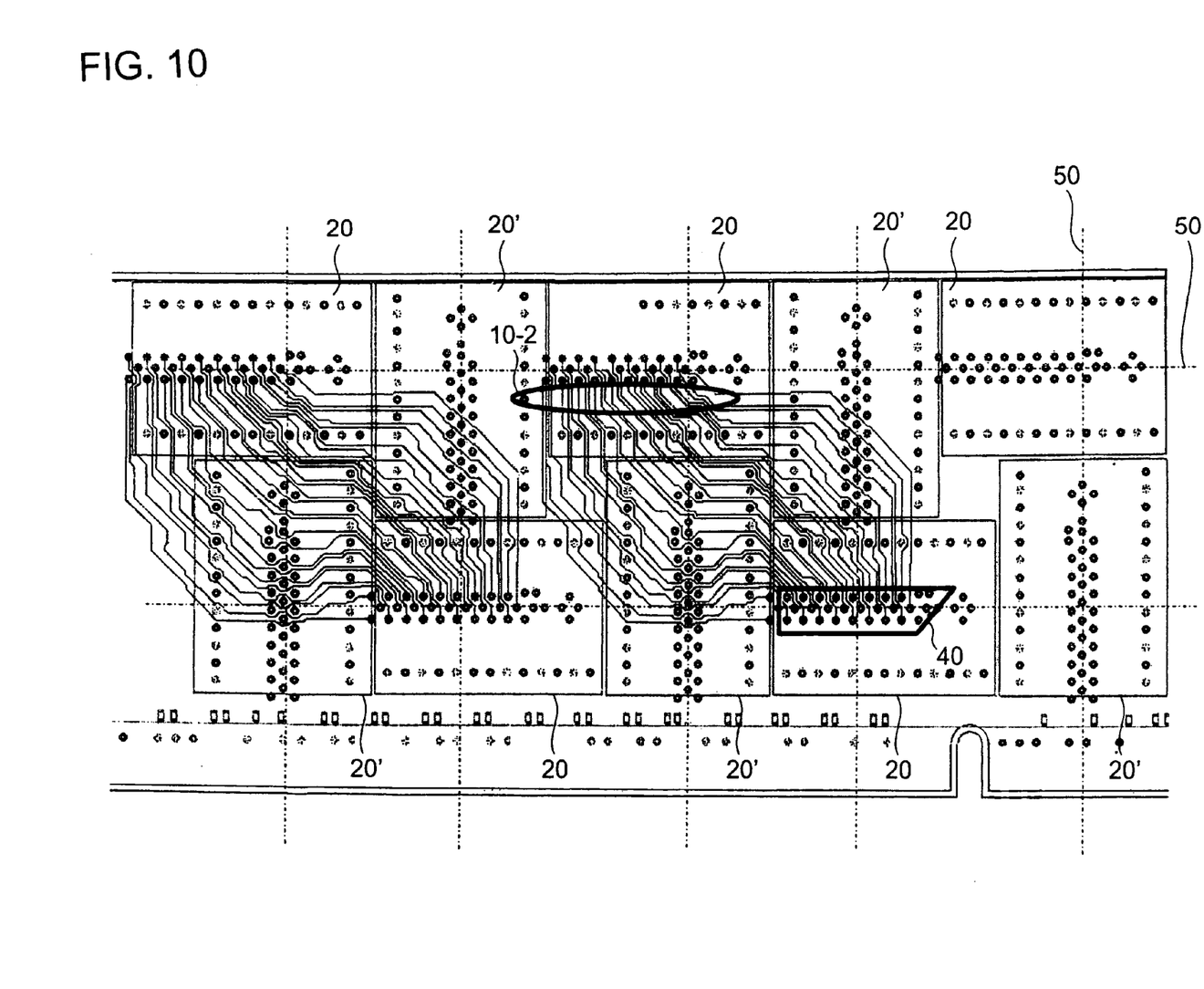
FIG. 10 is a detail diagram showing details of the wiring pattern of FIG. 9.

FIG. 9 and FIG. 10 are diagrams showing a wiring pattern in still another wiring layer of the wiring board 100. FIG. 9 is a simplified schematic diagram of the wiring pattern, while FIG. 10 is a wiring pattern diagram corresponding to the wiring pattern of FIG. 9, showing a representation closer a product image.

The wiring layer shown in FIGS. 9 and 10 is provided with signal wiring groups 10-2 connecting via hole groups 40 provided corresponding to semiconductor devices 20. Each signal wiring group 10-2 connects between the via holes included in the via hole group 40 in the lower row and the via holes included in the via hole group 40 located diagonally upward left in the upper row, so that the semiconductor devices 20 corresponding to these via hole groups 40 and having index marks pointing to the same direction are connected to each other. The signal wiring groups 10-2 corresponds to the other half of the signal wiring groups 10 shown in FIG. 3. In the signal wiring group 10-2 as well, the wiring lines located at the opposite ends of the group and the wiring lines located in a central part have substantially equal lengths.

Figure 11:
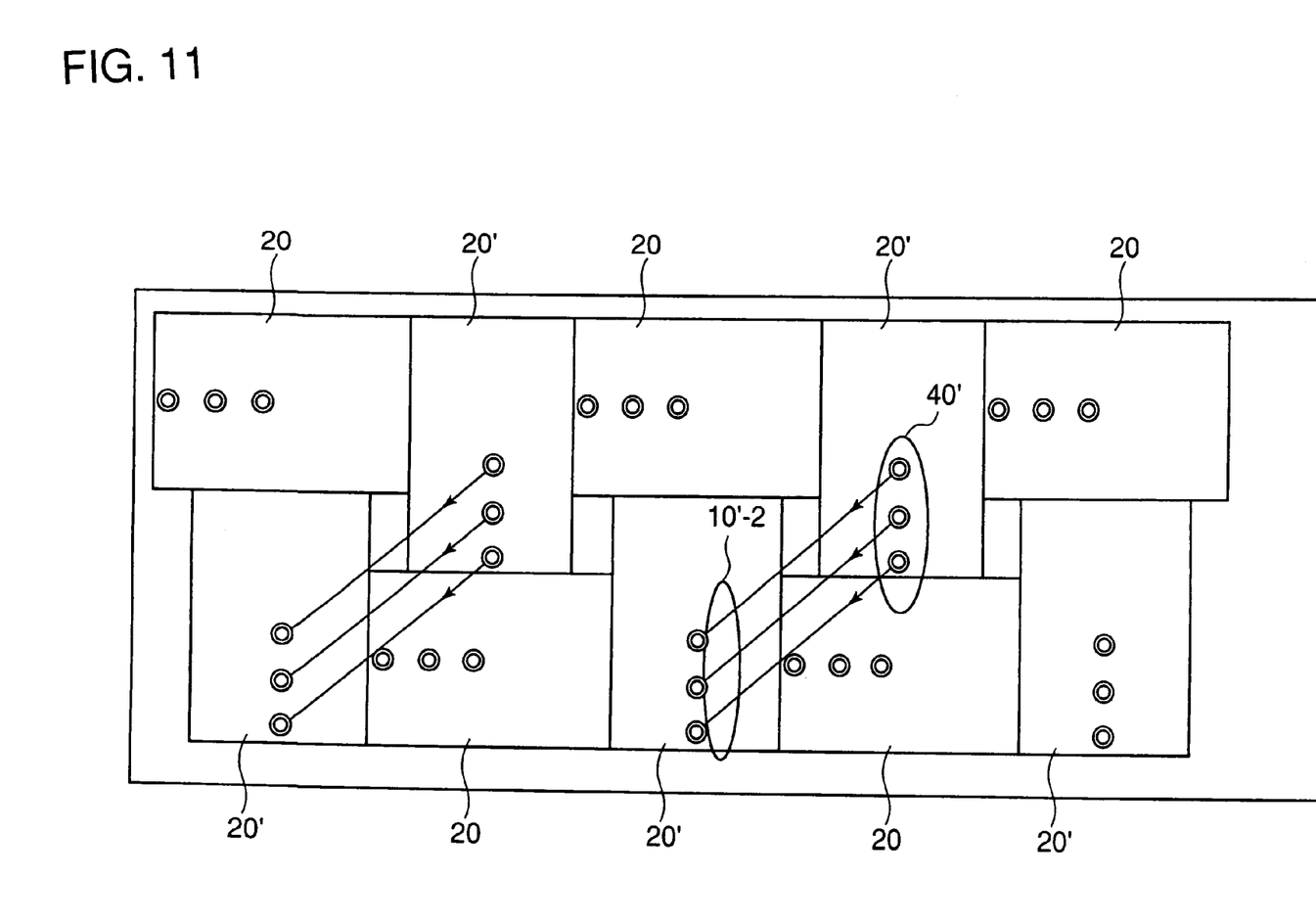
FIG. 11 is a schematic diagram showing an example of a wiring pattern in still another wiring layer forming the wiring board used in the semiconductor module of FIG. 3.
Figure 12:
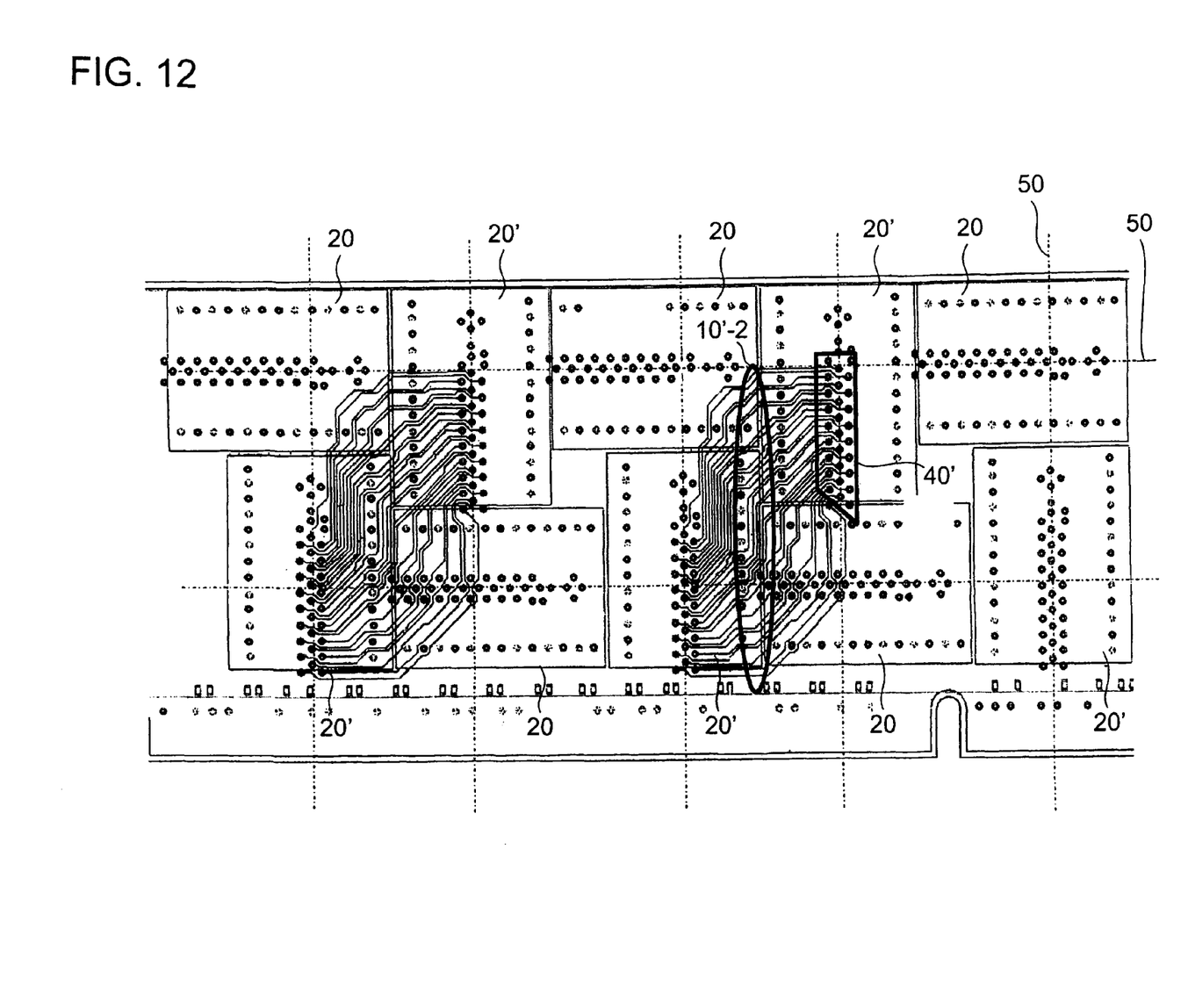
FIG. 12 is a detail diagram showing details of the wiring pattern of FIG. 11.

FIG. 11 and FIG. 12 are diagrams showing a wiring pattern in still another wiring layer of the wiring board 100. FIG. 11 is a simplified schematic diagram of the wiring pattern, while FIG. 12 is a wiring pattern diagram corresponding to that of FIG. 11, showing a representation closer to a product image.

The wiring layer shown in FIGS. 11 and 12 is provided with signal wiring groups 10'-2 connecting via hole groups 40' provided corresponding to semiconductor devices 20'. Each signal wiring group 10'-2 connects between the via holes included in the via hole group 40' in the upper row and the via holes included in the via hole group 40' located diagonally downward left in the lower row, so that semiconductor devices 20' corresponding to these via hole groups 40' and having index marks pointing to the same direction are electrically connected to each other. The signal wiring groups 10'-2 correspond to the other half of the signal wiring groups 10' shown in FIG. 3. In each signal wiring group 10'-2 as well, the wiring lines located at the opposite ends of the group and the wiring line located in a central part have substantially equal lengths.

The wiring board 100 is formed by superposing the wiring patterns shown in FIG. 5, FIG. 7, FIG. 9, and FIG. 11 (or those shown in FIG. 6, FIG. 8, FIG. 10, and FIG. 12).

According to the shown embodiment, a semiconductor device included in one of the two rows is connected to a semiconductor device included in the other row and having the same orientation (having an index mark pointing to the same direction), instead of connecting adjacent semiconductor devices in the same row as in the related semiconductor module. Thus, signal wiring lines can be formed to have equal lengths, which makes it possible to reduce the signal-to-signal skew between two semiconductor devices connected to each other.

In the wiring patterns shown in FIGS. 5, 7, 9 and 11, a shape formed by additional lines passing through the centers of the via hole groups 40, 40' is not line-symmetric, unlike the description which has been made with reference to FIGS. 4A and 4B. Therefore, the lengths of the wiring lines of the signal wiring groups 10-1, 10-2 are not necessarily equal to the lengths of the wiring lines of the signal wiring groups 10-1', 10-2'. However, the wiring lines included in each signal wiring group have substantially equal lengths. Accordingly, this configuration is also capable of reducing the signal-to-signal skew between two semiconductor devices connected to each other, as described above.

It is apparent that the present invention is not limited to the above embodiments, but may be modified and changed without departing from the scope and spirit of the invention. For example, although the embodiment above has been described in terms of the case where a multilayer wiring board consisting of four wiring layers is used, the multilayer wiring board used in the present invention may consist of more than or less than four wiring layers.

What is claimed is:

1. A semiconductor module, comprising:
a plurality of rectangular shaped semiconductor devices which are arranged in two rows such that each pair of adjacent semiconductor devices is in orientations differed by 90 degrees from each other; and
a plurality of wirings which couple the semiconductor devices included in one of the two rows to the semiconductor devices included in the other row such that the semiconductor devices arranged in the same orientations are coupled to each other without any coupling to semiconductor devices having different orientations.

2. The semiconductor module as claimed in claim 1, wherein each of the wirings comprises a plurality of wiring lines connecting one semiconductor device to another semiconductor device, these wiring lines being provided to have equal lengths.

3. The semiconductor module as claimed in claim 1, wherein the wirings are provided to connect the semiconductor devices belonging to one of the two rows and the semiconductor devices belonging to the other row alternately.

4. The semiconductor module as claimed in claim 1, wherein the wirings are provided by a form of a multilayer wiring board.

5. A wiring method for a semiconductor module, said method comprising:
arranging a plurality of rectangular-shaped semiconductor devices in two rows such that each pair of adjacent semiconductor devices is in orientations differed by 90 degrees from each other; and
electrically connecting the semiconductor devices included in one of the two rows to the semiconductor devices included in the other row by using a plurality of wirings such that the semiconductor devices arranged in the same orientations are coupled to each other without any coupling to semiconductor devices having different orientations.

6. The wiring method as claimed in claim 5, wherein the wirings comprises a plurality of wiring lines connecting one semiconductor device to another semiconductor device, these wiring lines being provided to have equal lengths.

7. The wiring method as claimed in claim 5, wherein the wirings are provided to connect the semiconductor devices belonging to one of the two rows and the semiconductor devices belonging to the other row alternately.

8. The wiring method as claimed in claim 5, wherein the wirings are provided by a form of a multilayer wiring board.

9. A wiring board for a semiconductor module, said wiring board comprising:
a region on which a plurality of rectangular-shaped semiconductor devices arranged in two rows such that each pair of adjacent semiconductor devices is in orientations differed by 90 degrees from each other; and
wirings which are used to couple the semiconductor devices included in one of the two rows to the semiconductor devices included in the other row such that the semiconductor devices arranged in the same orientations are coupled to each other without any coupling to semiconductor devices having different orientations.

10. The wiring board as claimed in claim 9, wherein each of the wirings includes a plurality of wiring lines connecting one semiconductor device to another semiconductor device, these wiring lines being provided to have equal lengths.

11. The wiring board as claimed in claim 9, wherein the wirings are provided to connect the semiconductor devices belonging to one of the two rows and the semiconductor devices belonging to the other row alternately.

12. The wiring board as claimed in claim 9, wherein the wiring board comprises a multilayer wiring board.

13. The semiconductor module of claim 1, wherein the semiconductor devices arranged in the two rows comprise identical devices, thereby interconnecting corresponding terminals in the same orientations in the other row forms substantially parallel wiring patterns in a diagonal region between terminals of two semiconductor devices in two rows.

14. The semiconductor module of claim 13, wherein lengths of the wirings of a wiring group interconnecting semiconductor devices of the same orientation in the two rows are substantially equal in a symmetric manner relative to a center line between two interconnected semiconductor devices, the substantially equal lengths thereby reducing a signal-to-signal skew in the two interconnected semiconductor devices.

15. The semiconductor module of claim 1, wherein the wiring groups interconnecting the semiconductor devices of the same orientation in the two rows thereby form a zigzag pattern.

16. The semiconductor module of claim 15, wherein vias are used to connect terminals of the semiconductor devices to a wiring layer in a multilayer wiring board and wherein a first wiring layer is used for interconnecting one orientation and a second wiring layer is used for interconnecting the second orientation, the interconnections of the two orientations thereby forming crisscross patterns involving two different wiring layers.

17. The wiring board of claim 9, wherein the semiconductor devices arranged in the two rows comprise identical devices, thereby interconnecting corresponding terminals in the same orientations in the other row forms substantially parallel wiring patterns in a diagonal region between the terminals.

18. The wiring board of claim 17, wherein lengths of the wirings of a wiring group interconnecting semiconductor devices of the same orientation in the two rows are substantially equal in a symmetric manner relative to a center line between two interconnected semiconductor devices, the substantially equal lengths thereby reducing a signal-to-signal skew in the two interconnected semiconductor devices.

19. The wiring board of claim 9, wherein the wirings interconnecting the semiconductor devices of the same orientation in the two rows thereby form a zigzag pattern.

20. The wiring board of claim 19, wherein vias are used to connect terminals of the semiconductor devices to a wiring layer in a multi layer wiring board and wherein a first wiring layer is used for interconnecting one orientation and a second wiring layer is used for interconnecting the second orientation, the interconnections of the two orientations thereby forming crisscross patterns involving two different wiring layers.

* * * * *